United States Patent
Hayashi (10) Patent No.: US 7,521,713 B2
(45) Date of Patent: Apr. 21, 2009

(54) SEMICONDUCTOR DEVICE HAVING ELECTROSTATIC DISCHARGE ELEMENT

(75) Inventor: Hirokazu Hayashi, Tokyo (JP)

(73) Assignee: Oki Semiconductor Co., Ltd., Tokyo (JP)

( * ) Notice: Subject to any disclaimer, the term of this patent is extended or adjusted under 35 U.S.C. 154(b) by 112 days.

(21) Appl. No.: 11/180,681

(22) Filed: Jul. 14, 2005

(65) Prior Publication Data

US 2006/0054892 A1 Mar. 16, 2006

(30) Foreign Application Priority Data

Sep. 15, 2004 (JP) ............................. 2004-267676

(51) Int. Cl.
*H01L 29/10* (2006.01)
*H01L 29/76* (2006.01)

(52) U.S. Cl. ............................ 257/67; 257/69; 257/328; 257/338; 257/350; 257/357; 257/360; 257/414

(58) Field of Classification Search ................. 257/67, 257/328, 338, 350, 357, 360, 69, 414; 438/152, 438/153, 154

See application file for complete search history.

(56) References Cited

U.S. PATENT DOCUMENTS

| | | | | |
|---|---|---|---|---|
| 4,889,829 A | * | 12/1989 | Kawai | ........................ 438/405 |
| 5,808,319 A | * | 9/1998 | Gardner et al. | ................. 257/67 |
| 5,923,067 A | * | 7/1999 | Voldman | ..................... 257/349 |
| 6,127,701 A | * | 10/2000 | Disney | ........................ 257/338 |
| 6,483,111 B1 | * | 11/2002 | Ishikawa et al. | ......... 250/338.4 |
| 7,112,822 B2 | * | 9/2006 | Nagano et al. | ................. 257/79 |
| 2003/0122124 A1 | * | 7/2003 | Nagano et al. | ................. 257/48 |
| 2003/0122130 A1 | * | 7/2003 | Demkov et al. | ............... 257/67 |
| 2003/0214773 A1 | | 11/2003 | Kitagawa | |

FOREIGN PATENT DOCUMENTS

JP 2003-318265 11/2003

* cited by examiner

*Primary Examiner*—Jerome Jackson, Jr.
*Assistant Examiner*—Anthony Ho
(74) *Attorney, Agent, or Firm*—Kubotera & Associates, LLC (57) ABSTRACT

A semiconductor device includes a laminated substrate; a removal portion; a cavity; a first semiconductor element; and a second semiconductor element. In the laminated substrate, a bulk layer, an insulating layer, and a semiconductor layer are laminated in this order from a bottom. The laminated substrate includes a first area, a second area adjacent to the first area, and a third area adjacent to the second area in each of the layers. The semiconductor layer, the insulating layer, and an upper portion of the bulk layer in the first area are removed to form the removal portion. A part of the bulk layer in the second area is removed to form the cavity adjacent to the removal portion. The first semiconductor element is formed in the bulk layer in the removal portion as an ESD protection element. The second semiconductor element is formed partially in the semiconductor layer in the second area.

13 Claims, 7 Drawing Sheets

SEMICONDUCTOR DEVICE HAVING ELECTROSTATIC DISCHARGE ELEMENT

BACKGROUND OF THE INVENTION AND RELATED ART STATEMENT

The present invention relates to a semiconductor device with an SOI (silicon on insulator) structure having an ESD (electro static discharge) protection element for protecting an inner circuit from a large current exceeding a rated current due to static charge or lightening. The present invention also relates to a method of producing the semiconductor device.

In a conventional semiconductor device with an SOI structure having an ESD protection element, an insulating layer is formed on a bulk layer. A semiconductor layer is formed on the insulating layer as a semiconductor layer of a laminated substrate of the SOI structure. An N well layer and a P well layer are formed in the semiconductor layer to form an SCR (silicon controlled rectifier) element as the ESD protection element for protecting an inner circuit from an influence of static charge (refer to Patent Reference 1).

Patent Reference 1: Japanese Patent Publication (Kokai) No. 2003-318265

Figure 11:
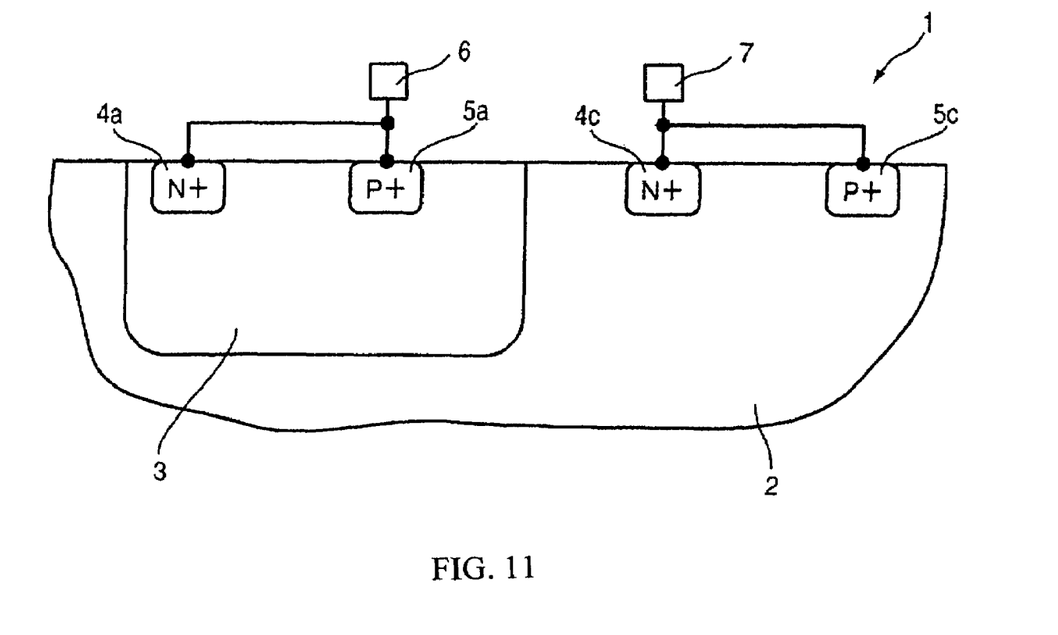
FIG. 11 is a schematic diagram showing an SCR element.

In general, the SCR element formed on a silicon substrate has a structure shown in FIG. 11. In the SCR element 1 shown in FIG. 11, a P type silicon substrate 2 is formed of a silicon layer with a p type impurity such as boron and aluminum diffused uniformly. An N well layer 3 is formed in the silicon substrate 2 by partially diffusing an N type impurity such as phosphorous and arsenic. An N+ area 4a with the N type impurity diffused at a higher concentration and a P+ area 5a with the P type impurity diffused at a concentration higher than that of the N type impurity of the N well layer 3 are formed on a surface of the N well layer 3. The N+ area 4a and P+ area 5a are connected to an anode 6. An N area 4c with the N type impurity partially diffused and a P area 5c with the P impurity partially diffused are formed in the silicon substrate 2 adjacent to the N well layer 3, and are connected to a cathode 7.

Figure 12:
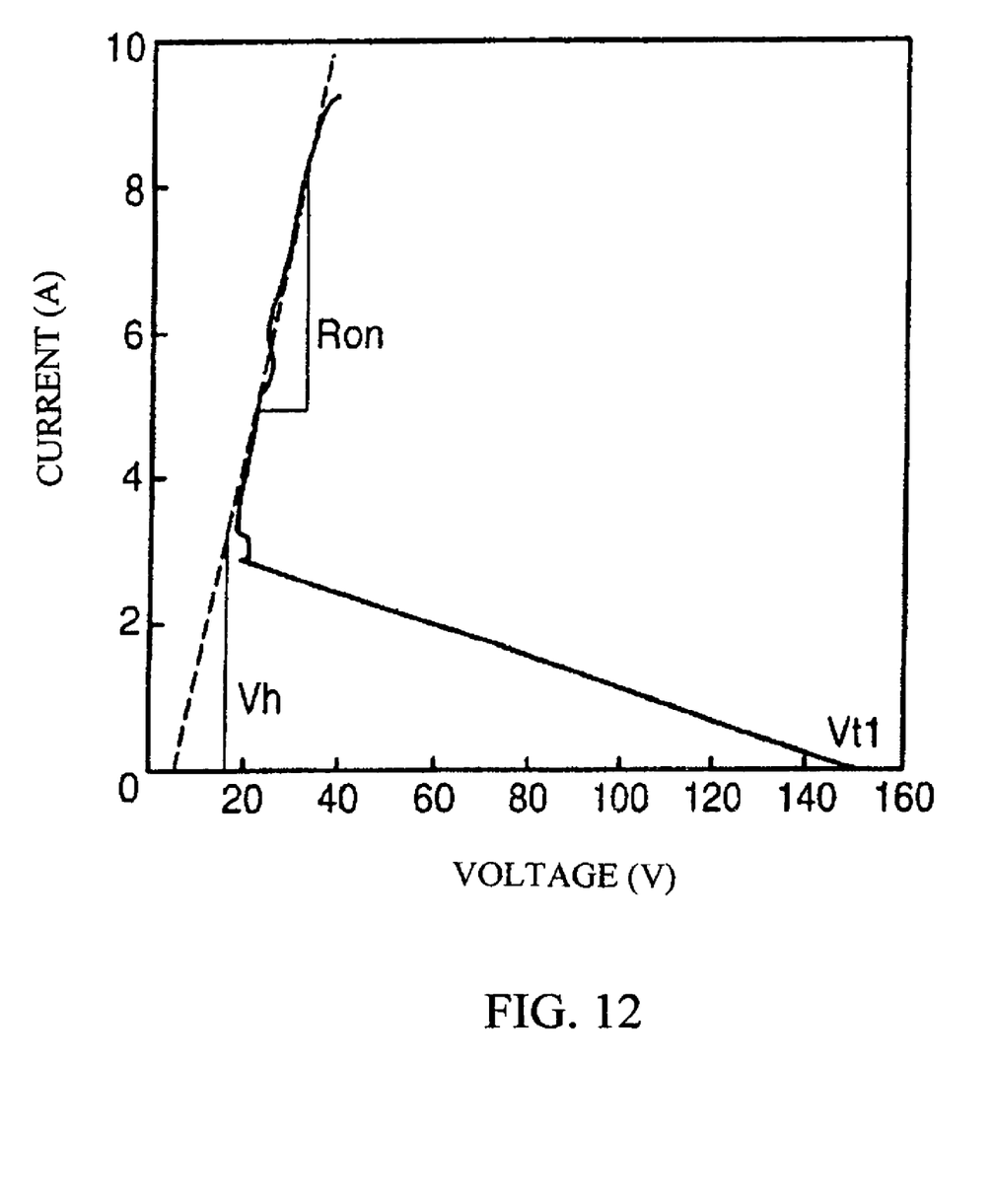
FIG. 12 is a graph showing a current-voltage relationship of an SCR element.

In an operation of the SCR element 1, when a voltage is applied between the anode 6 and the cathode 7, the N+ area 4a and the P+ area 5a formed on the N well layer 3 have a same potential. Accordingly, an opposite voltage is applied to the N+ area 4a, so that electron holes do not flow through a P-N connection between the N well layer 3 and the P+ area 5a. When the voltage reaches a breakdown voltage Vt1 as shown in FIG. 12, a suppression balance of the P-N connection between the N well layer 3 and the P+ area 5a is broken down. Accordingly, a current rapidly flows between the anode 6 and the cathode 7 through the P+ area 5a, the N well layer 3, the P type semiconductor substrate 2, and the N+ area 4c. As a result, an on resistance Ron decreases, and a current flows with a small hold voltage Vh, thereby reducing power consumption of the SCR element 1 and heat generation thereof. Accordingly, it is necessary to provide the N well layer 3 in the SCR element 1 to perform the thyristor operation.

Recently, an operational speed and a packaging density of a semiconductor have been increased. As a result, a size of a semiconductor element has been reduced, thereby reducing a gate length of an MOS (metal oxide semiconductor) element. Accordingly, a semiconductor having an SOI structure has become a main stream. In the semiconductor having an SOI structure, a thin silicon layer is formed on an insulating layer formed on a bulk layer as a semiconductor layer, thereby reducing a short channel effect due to a high packaging density.

In the conventional technology described above, the SCR element is formed on the semiconductor layer as the ESD protection element. Accordingly, when the semiconductor layer is formed of a thin silicon layer, it is difficult to form the well layer necessary for the SCR element. As a result, the SCR element does not have sufficient function as the ESD protection element. When the semiconductor layer has a large thickness to form the well layer, it is difficult to reduce the short channel effect and obtain the high packaging density.

In view of the problems described above, an object of the present invention is to provide a method of producing a semiconductor device, in which it is possible to form an ESD protection element operating effectively even when a semiconductor with an SOI structure has a thin semiconductor layer.

Further objects and advantages of the invention will be apparent from the following description of the invention.

SUMMARY OF THE INVENTION

In order to attain the objects described above, according to the present invention, a semiconductor device includes a laminated substrate; a removal portion; a cavity; a first semiconductor element; and a second semiconductor element. In the laminated substrate, a bulk layer, an insulating layer, and a semiconductor layer are laminated in this order from a bottom. The laminated substrate includes a first area, a second area adjacent to the first area, and a third area adjacent to the second area in each of the layers. The semiconductor layer, the insulating layer, and an upper portion of the bulk layer in the first area are removed to form the removal portion. An upper portion of the bulk layer in the second area is removed to form the cavity adjacent to the removal portion. The first semiconductor element is formed in the bulk layer in the removal portion. The second semiconductor element is formed partially in the semiconductor layer in the second area. The first semiconductor element includes an ESD protection element.

In the invention, it is possible to easily form the ESD protection element in the relatively thick P type semiconductor substrate in the semiconductor device with an SOI structure having a thin semiconductor silicon layer. It is possible to effectively operate the ESD protection element and provide an inner circuit with a high packaging density using the thin semiconductor layer.

DETAILED DESCRIPTION OF PREFERRED EMBODIMENTS

Hereunder, embodiments of the present invention will be explained with reference to the accompanying drawings.

First Embodiment

Figure 1:
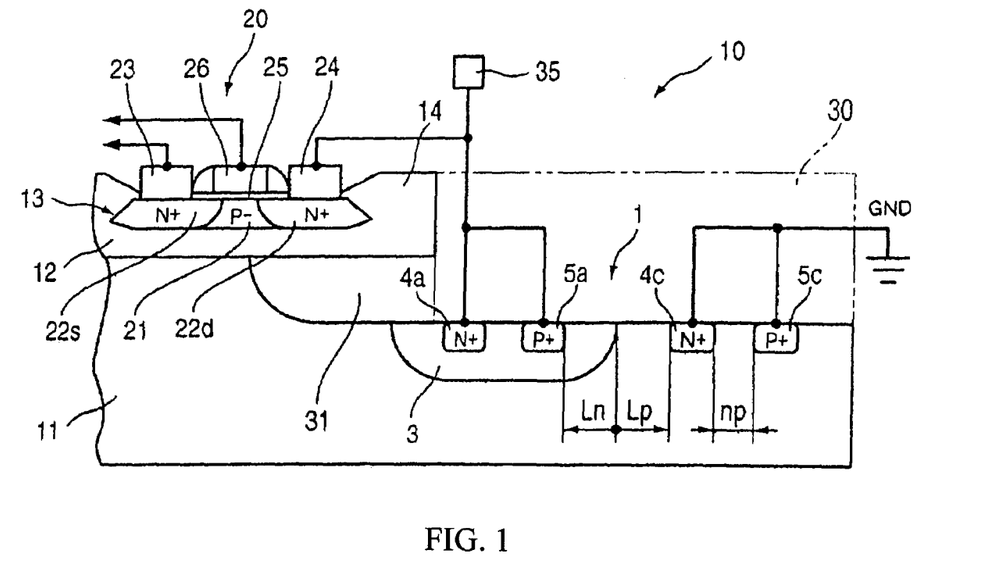
FIG. 1 is a sectional view showing a vicinity of an ESD protection element according to a first embodiment of the present invention.
Figure 2:
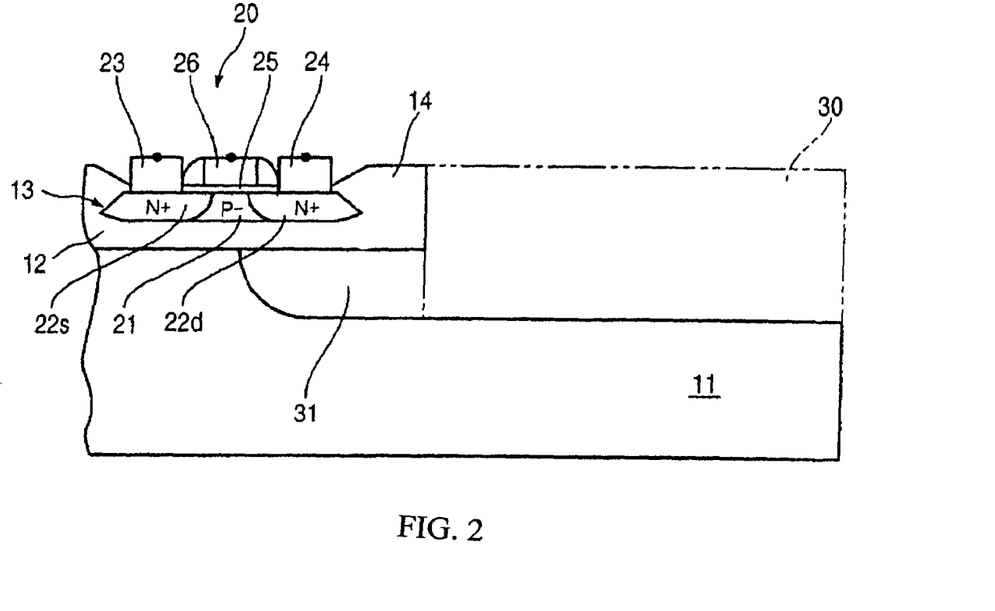
FIG. 2 is a schematic diagram showing a process of producing a semiconductor according to the first embodiment.

In FIGS. 1 and 2, components same as those in FIG. 11 are designated by the same reference numerals and explanations thereof are omitted. A semiconductor device 10 has an SOI structure and is formed of a laminated substrate. The laminated substrate is formed of a P type semiconductor substrate 11; an insulating layer 12 formed on the P type substrate 11; and a semiconductor layer 13 formed on the insulating layer 12. The P type semiconductor 11 is a bulk layer formed of a relatively thick silicon substrate with a P type impurity doped uniformly. The insulating layer 12 is formed of an insulating material such as silicon dioxide ($SiO_2$), and the semiconductor layer 13 is formed of a thin silicon layer. An inner circuit is formed inside the laminated substrate.

The laminated substrate has three areas, namely a first area where a removal portion 30 (described alter) is formed; a second area adjacent to the first area where a cavity 31 is formed; and a third area adjacent to the first and second areas as an area other than the first and second areas. The inner circuit is formed of various elements formed in the semiconductor layer 13. Sides of each of the various elements are separated with an element separation area 14. The element separation area 14 is an insulating oxide layer formed with a selective oxidation method such as LOCOS (local oxidation of silicon).

An inner element of the inner circuit shown in FIG. 1 is an N channel MOS element 20 (n-MOS element 20) as a second semiconductor element, i.e., a type of MOSFET (MOS field effect transistor). A P type impurity is added and diffused in the semiconductor layer 13 to form a channel 21 as a P− area, so that the channel 21 has a negative potential. An N type impurity is added and diffused in the semiconductor layer 13 to form N+ areas 22s and 22d arranged on both sides of the channel 21. The n-MOS element 20 includes a source electrode 23 connected to the N+ area 22s; a drain electrode 24 connected to the N+ area 22d; and a gate electrode 26 facing the channel 21 through an insulating layer 25 made of silicon dioxide. The n-MOS element 20 controls a current flowing though the channel 21 between the source electrode 23 and the drain electrode 24 according to a potential applied to the gate electrode 26.

The removal portion 30 is formed in the first area as indicated by a phantom line in FIG. 2. As shown in FIG. 2, after the element separation area 14 is formed in the semiconductor layer 13, the semiconductor layer 13 and the insulating layer 12 are removed at a part or an entire portion of edges thereof between the element separation area 14 and four side surfaces of the semiconductor device 1. Then, a part, or an upper portion, of the P type substrate 11 adjacent to the insulating layer 12 is removed to form the removal portion 30.

The cavity 31 is formed in the second area. The upper portion of the P type substrate 11 adjacent to the removal portion 30 in the P type substrate 11, i.e., a portion just below the insulating layer 12, is removed up to a point close to the N+ area 22d connected to the drain electrode 24, thereby forming the cavity 30. After the semiconductor device 10 is produced, the cavity 31 becomes an air layer for functioning as a low capacitance area.

A signal terminal 35 is connected to the drain electrode 24 of the n-MOS element 20, i.e., the inner element, for inputting an external signal to the inner circuit. The source electrode 23 and the gate electrode 26 are connected to corresponding locations of the inner circuit, respectively. The SCR element 1 is formed on the P type substrate 11 at the removal portion 30 with a method similar to that shown in FIG. 11. As shown in FIG. 1, an N+ area 4c and a P+ area 5c on a cathode side are connected to ground, and an N+ area 4a and a P+ area 5a formed on a front surface of an N well 3 are connected to the signal terminal 35. Accordingly, the SCR element 1 functions as an ESD protection element, or a first semiconductor element, according to the first embodiment of the present invention.

An effect of the structure described above will be explained next. The removal portion 30 is formed in the P type substrate 11 with the following method. First, the laminated substrate with the SOI structure is prepared, and the element separation area 14 is formed in the semiconductor layer 13 with the selective oxidation method such as LOCOS, so that the elements of the inner circuit are formed in the surrounded area. Then, the edges between the element separation area 14 and the side surfaces of the semiconductor device 1, or the semiconductor layer 13 and the insulating layer 12 in the first area, are removed with anisotropic etching such as plasma etching, thereby exposing the P type substrate 11.

In the next step, the P type substrate 11 is further removed toward the insulating layer 12 with anisotropic etching such as plasma etching using sulfur hexafluoride ($SF_6$), thereby removing the upper portion of the P type substrate 11 to form the removal portion 30. At this time, the P type substrate 11 just below the insulating layer 12 in the second area adjacent to the removal portion 30 is removed up to the point close to the N+ area 22d connected to the drain electrode 24 of the n-MOS element 20. Accordingly, the cavity 31 with a depth of about 100 μm is formed adjacent to the insulating layer 12 at the upper portion of the P type substrate 11 in the second area. Incidentally, the insulating layer 12 and the semiconductor layer 13 above the cavity 31 in the second area have thicknesses large enough, so that the semiconductor layer 13 situated above the cavity 31 does not deform when the cavity 31 is formed.

The N type impurity is partially added and diffused in an upper surface of the P type substrate 11 adjacent to the cavity 31, or a bottom surface of the removal portion 30, thereby forming the N well layer 3. The N type impurity is partially added and diffused in a front surface of the N type well 3 at a higher concentration, thereby forming an N+ area 4a. Further, the P type impurity is partially added and diffused in the front surface of the N type well 3 at a concentration higher than that of the N type impurity in the N type well 3, thereby forming a P+ area 5a.

The N type impurity is partially added and diffused in the side surface of the P type substrate 11 of the semiconductor device 10 adjacent to the N type well 3 at a concentration higher than that of the P type impurity in the P type substrate 11, thereby forming an N+ area 4c. Further, the P type impurity is partially added and diffused in the side surface of the P type substrate 11 at a concentration higher than that of the P type impurity in the P type substrate 11, thereby forming a P+ area 5c. Accordingly, the SCR element 1 is formed on the P type substrate 11 at the bottom surface of the removal portion 30 as the ESD protection element. As shown in FIG. 1, the SCR element 1 is connected to the N type well 35, and the n-MOS element 20 is connected as the inner element.

In order to operate the SCR element 1 as the ESD protection element, it is necessary to set a breakdown voltage of the SCR element 1 lower than a breakdown voltage of the inner element of the inner circuit such as the n-MOS element 20. The breakdown voltage of the SCR element 1 is function of a distance from an edge of the P+ area 5a in the N type well 3 to a boundary between the N type well 3 and the P type substrate 11 (Ln length); a distance from an edge of the N+ area 4c in the P type substrate 11 to the boundary between the N type well 3 and the P type substrate 11 (Lp length); and a distance from an edge of the N+ area 4c in the P type substrate 11 to an edge of the P+ area 5c in the P type substrate 11 (np length).

Figure 3:
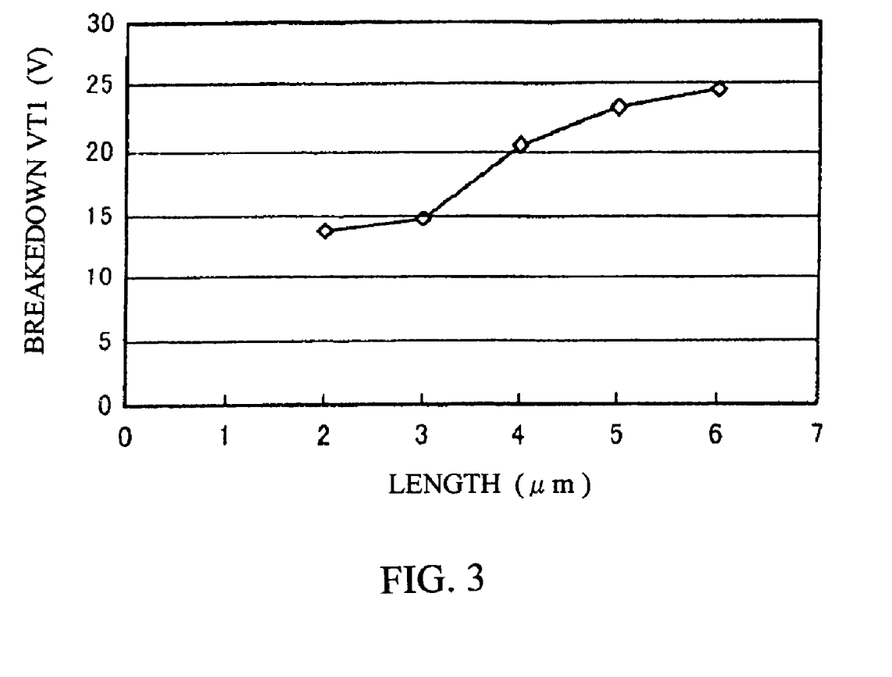
FIG. 3 is a graph showing an experimental result of an Ln length dependence of a breakdown voltage of an SCR element according to the first embodiment.
Figure 4:
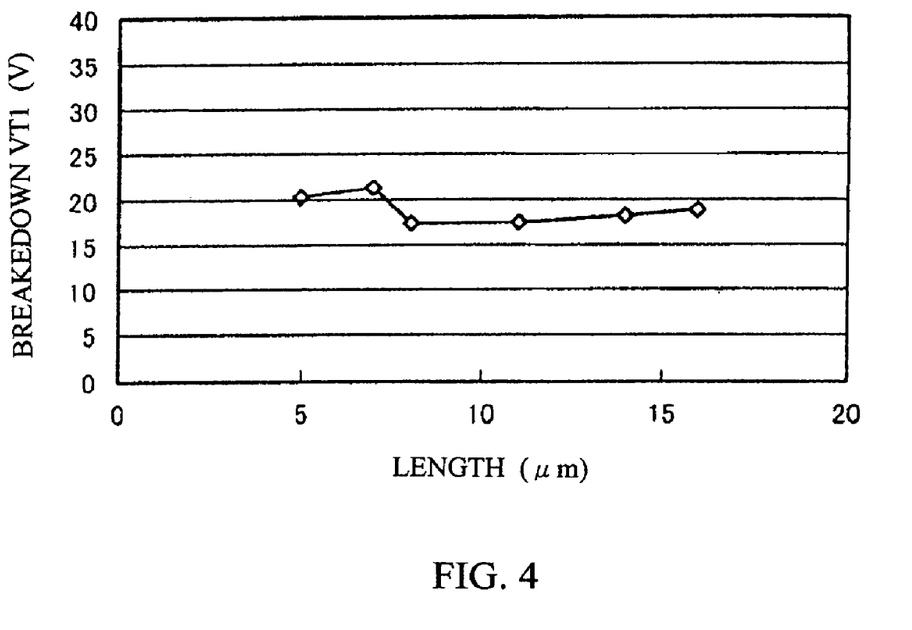
FIG. 4 is a graph showing an experimental result of an Lp length dependence of the breakdown voltage of the SCR element according to the first embodiment.
Figure 5:
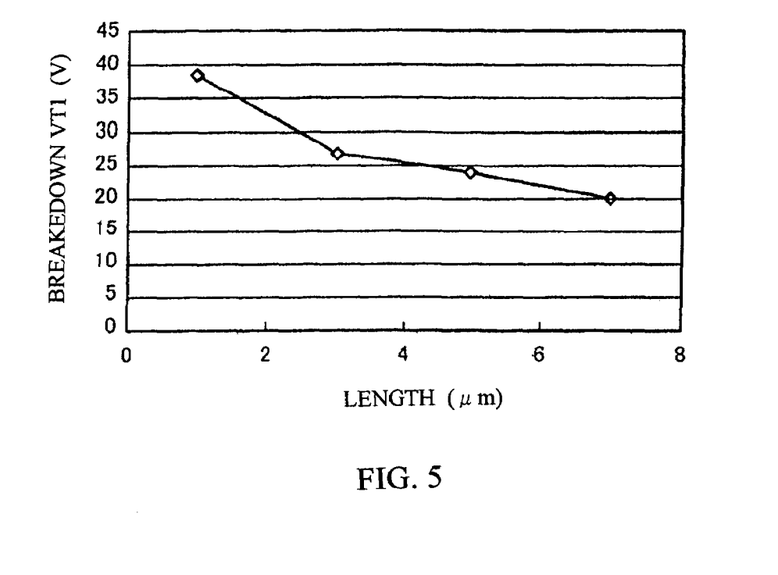
FIG. 5 is a graph showing an experimental result of an np length dependence of the breakdown voltage of the SCR element according to the first embodiment.

FIGS. 3 to 5 are graphs showing an experimental result of an Ln length dependence, an LP length dependence, and an np length dependence of the breakdown voltage of the SCR element 1, respectively. In the charts, the horizontal axis represents each length, and the vertical axis represents a breakdown voltage Vt1 of the SCR element 1.

As shown in FIGS. 3 to 5, it is evident that the breakdown voltage Vt1 decreases as the Ln length or the Lp length decreases and the np length increases. Using this characteristic, it is possible to set the breakdown voltage Vt1 of the SCR element 1 lower than the breakdown voltage of the inner circuit, thereby effectively operating the SCR element 1 as the ESD protection element.

When a large current above a rated current due to static charge is applied to the N type well 35 of the semiconductor device 10 with the SCR element 1 having the breakdown voltage lower than the breakdown voltage of the inner circuit, the large potential is applied to the N+ area 4a and 25a on the anode side of the SCR element 1 and the drain electrode 24 of the n-MOS element 20. Since the breakdown voltage of the SCR element 1 is set lower than the breakdown voltage of the inner circuit, the SCR element 1 reaches the breakdown voltage first, and the large current quickly flows though the SCR element 1, thereby protecting the inner circuit from the static charge.

Further, the cavity 31 as the air layer is disposed below the drain electrode 24 of the n-MOS element 20, or the second semiconductor element, constituting the inner circuit. Accordingly, it is possible to reduce capacitance of a depleted layer between the channel 21 and the N+ area 22d connected to the drain electrode 24, thereby increasing an operation speed of the n-MOS element 20. As described above, when at least a part of the second semiconductor element is formed in the second area, it is possible to increase an operation speed of the semiconductor element.

In the first embodiment, as described above, the semiconductor layer and the insulating layer in the first area are removed to form the removal portion extending into a part of the P type semiconductor substrate as the bulk layer and the cavity extending just below the insulating layer in the second area. The SCR element is formed on the P type semiconductor substrate as the ESD protection element. Accordingly, it is possible to easily form the ESD protection element in the relatively thick P type semiconductor substrate in the semiconductor device with an SOI structure having a thin semiconductor silicon layer. It is possible to effectively operate the ESD protection element and provide the inner circuit with a high packaging density using the thin semiconductor layer.

Further, the cavity is provided just below the inner circuit as the air layer with low capacitance, thereby increasing an operation speed of the inner circuit formed in the semiconductor layer. In the first embodiment, the SCR element is formed on the P type semiconductor substrate as the ESD protection element. Alternatively, an MOSFET or a PN diode may be used for the ESD protection element as the first semiconductor element.

Second Embodiment

Figure 6:
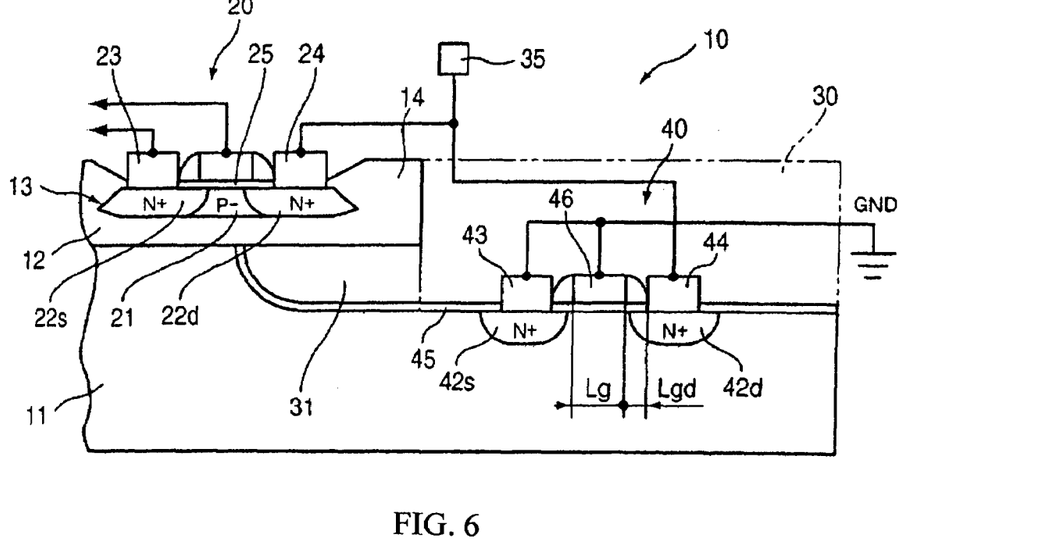
FIG. 6 is a sectional view showing a vicinity of an ESD protection element according to a second embodiment of the present invention.

FIG. 6 is a sectional view showing a vicinity of an ESD protection element according to a second embodiment of the present invention. Components same as those in the first embodiment are designated by the same reference numerals and explanations thereof are omitted. In the second embodiment, an n-MOS, or MOSFET, is used as the ESD protection element.

As shown in FIG. 6, an n-MOS element 40 is formed on the P type substrate 11 at the bottom of the removal portion 30 similar to the first embodiment. The N type impurity is added and diffused in the front surface of the P type substrate 11 at a concentration higher than that of the P type impurity in the P type substrate 11, thereby forming N+ areas 42s and 42d. An area of the P type substrate 11 between the N+ areas 42s and 42d functions as a channel (P− area) of the n-MOS element 40.

A source electrode 43 and a drain electrode 44 are connected to the N+ areas 42s and 42d, respectively. A gate electrode 46 faces the channel 21 through an insulating layer 45 made of silicon dioxide. The insulating layer 45 is formed after the removal portion 30 and the cavity 31 are formed. As shown in FIG. 6, the source electrode 43 and the gate electrode 46 are connected to ground, and the drain electrode 44 is connected to the signal terminal 35. Accordingly, the n-MOS element 40 functions as the ESD protection element according to the second embodiment of the present invention. Similar to the first embodiment, the n-MOS element 20, or the second semiconductor element, is connected as the inner element of the inner circuit.

An effect of the structure described above will be explained next. The steps of forming the removal portion 30 and the cavity 31 in the semiconductor device 10 with the SOI structure are the same as those in the first embodiment, and explanations thereof are omitted. The N type impurity is added and diffused in the front surface of the P type substrate 11 adjacent to the cavity 31 at a concentration higher than that of the P type impurity in the P type substrate 11, thereby forming the N+ areas 42s and 42d. A negative potential is applied to the area of the P type substrate 11 between the N+ areas 42s and 42d to function as the channel (P− area). Portions of the N+ areas 42s and 42d connected to the source electrode 43 and the drain electrode 44 are masked, and the insulating layer 45 is formed on the surface of the P type substrate 11 at the removal portion 30 and the cavity 31. Then, the source electrode 43 and the drain electrode 44 are connected to the N+ areas 42s and 42d, respectively, and the gate electrode 46 is formed.

Accordingly, the n-MOS element 40 is formed on the surface of the P type substrate 11 at the bottom of the removal portion 30 as the ESD protection element. Similar to FIG. 6, the N type well 35 is connected to the n-MOS element 40 and the n-MOS element 20.

In order to operate the n-MOS element 40 as the ESD protection element, it is necessary to set a breakdown voltage of the n-MOS element 40 lower than the breakdown voltage of the inner element of the inner circuit such as the n-MOS element 20. The breakdown voltage of the n-MOS element 40 is function of a gate length of the gate electrode 46 (Lg length); a distance from an edge of the gate electrode 46 to an edge of the drain electrode 44 (Lgd length); and a concentration of the N type impurity in the N+ area 42d. It is found that the breakdown voltage of the n-MOS element 40 decreases as the Lg length or the Lgd length decreases and the concentration of the N type impurity of the N+ area 42d increases. Using this characteristic, it is possible to set the breakdown voltage of the n-MOS element 40 lower than the breakdown voltage of the inner circuit, thereby effectively operating the n-MOS element 40 as the ESD protection element.

When a large current due to static charge is applied to the N type well 35 of the semiconductor device 10 with the n-MOS element 40 having the breakdown voltage lower than the breakdown voltage of the inner circuit, the large potential is applied to the drain electrode 44 of the n-MOS element 40 and the drain electrode 24 of the n-MOS element 20. Since the breakdown voltage of the n-MOS element 40 is set lower than the breakdown voltage of the inner circuit, the n-MOS element 40 reaches the breakdown voltage first, and the large current rapidly flows though the n-MOS element 40, thereby protecting the inner circuit from the static charge.

In the second embodiment, as described above, the removal portion and the cavity are provided. The n-MOS element is formed on the P type semiconductor substrate at the removal portion as the ESD protection element. Accordingly, it is possible to obtain advantages same as those in the first embodiment. In the second embodiment, the n-MOS element is provided as the ESD protection element. Alternatively, the MOSFET may be a P channel MOS element (p-MOS element) as the ESD protection element.

Third Embodiment

Figure 7:
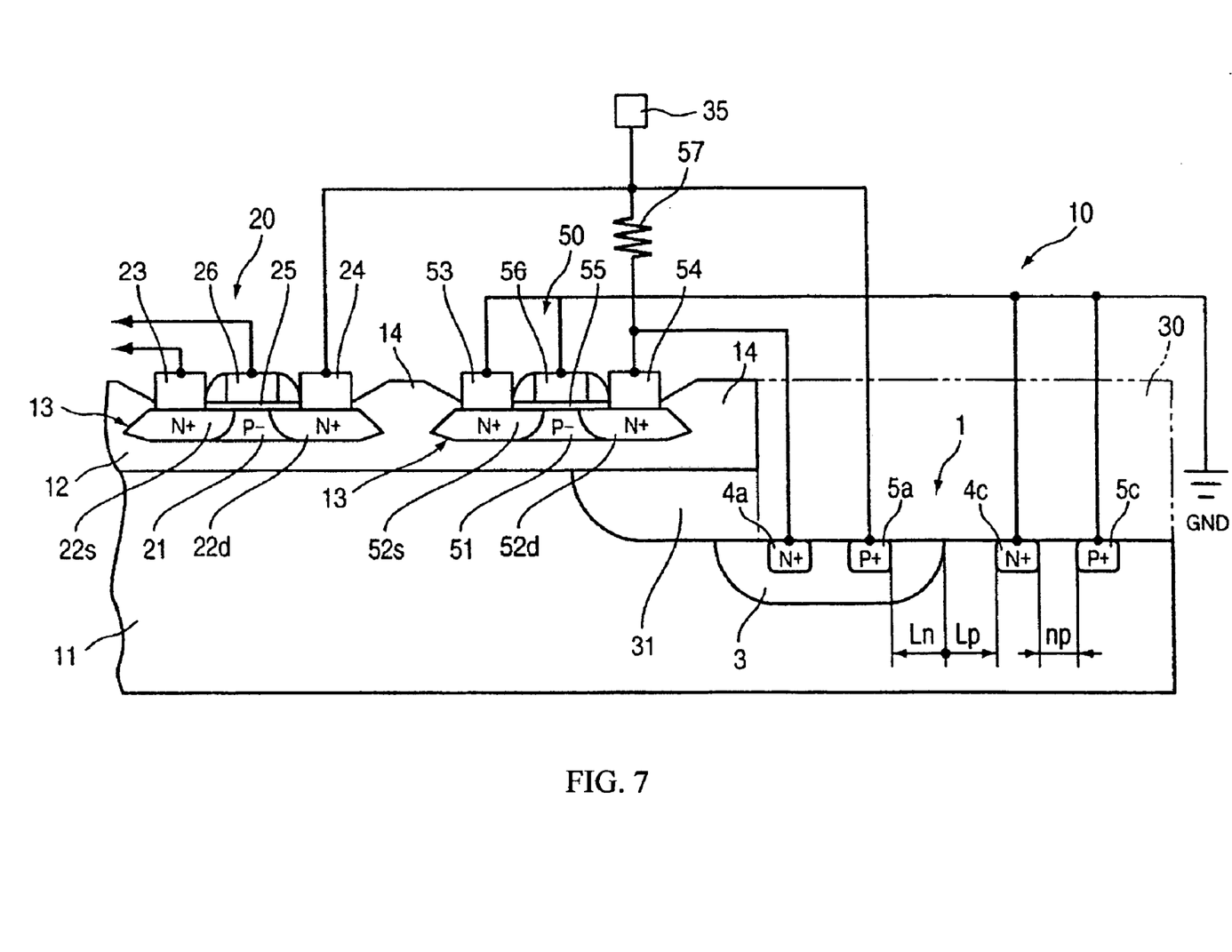
FIG. 7 is a sectional view showing a vicinity of an ESD protection element according to a third embodiment of the present invention.

FIG. 7 is a sectional view showing a vicinity of an ESD protection element according to a third embodiment of the present invention. Components same as those in the first embodiment are designated by the same reference numerals and explanations thereof are omitted. In the third embodiment, similar to the first embodiment, the SCR element 1, or the first semiconductor element, is formed on the P type substrate 11 at the removal portion 30 as the ESD protection element, and an n-MOS element, or the second semiconductor element, is provided as a trigger element.

As shown in FIG. 7, a trigger element 50, or the second semiconductor element, is formed in the semiconductor layer 13. In the embodiment, the trigger element 50 is an n-MOS element formed similarly to the n-MOS element 20 in the first embodiment. A P type impurity is added and diffused in the semiconductor layer 13 to form a channel 51 as a P− area with a negative potential. An N type impurity is added and diffused in the semiconductor layer 13 to form N+ areas 52s and 52d arranged on both sides of the channel 51. The n-MOS element 50 includes a source electrode 53 connected to the N+ area 52s; a drain electrode 54 connected to the N+ area 52d; and a gate electrode 56 facing the channel 51 through an insulating layer 55.

As shown in FIG. 7, the drain electrode 54 of the trigger element 50 is situated above the cavity 31 formed similarly to the first embodiment. The source electrode 53 and the gate electrode 56 are connected to ground, and the drain electrode 54 is connected to the signal terminal 35 through a resistance 57 (for example, 1 kΩ). Similar to the first embodiment, the ESD protection element of the third embodiment is the SCR element 1 formed on the P type substrate 11 at the bottom of the cavity 31 formed similarly to the first embodiment. As shown in FIG. 7, the N+ area 4c and the P+ area 5c on the cathode side are connected to ground; the N+ area 4a formed on the front surface of the N well layer 3 on the anode side is connected to a point between the drain electrode 54 of the trigger element 50 and the resistance 57; and the P+ area 5a is connected to the signal terminal 35. Accordingly, the SCR element 1 is electrically connected to the trigger element 50, and functions as the ESD protection element with the trigger element 50. Similar to the first embodiment, the n-MOS element 20 is connected as the inner element of the inner circuit.

An effect of the structure described above will be explained next. The removal portion 30 is formed in the P type substrate 11 with an SOI structure with the following method. First, the laminated substrate with an SOI structure is prepared, and the element separation area 14 is formed in the semiconductor layer 13 with the selective oxidation method such as LOCOS, so that the elements of the inner circuit and the trigger element 50, or the second semiconductor element, are formed in the surrounded area.

In the trigger element 50, the N type impurity is added and diffused in the semiconductor layer 13 surrounded by the element separation area 14, thereby forming N+ areas 52c and 52d. The P type impurity is added and diffused in an area between the N+ areas 52c and 52d. A negative potential is applied to the area to function as the channel 51 (P− area). Portions of the N+ areas 52c and 52d connected to the source electrode 53 and the drain electrode 54 are masked, and the insulating layer 55 is formed thereon. Then, the source electrode 53 and the drain electrode 54 are connected to the N+ areas 52c and 52d, respectively, and the gate electrode 56 is formed. In this case, the trigger element 50 is preferably formed when the inner element is formed in the semiconductor layer 13.

Figure 8:
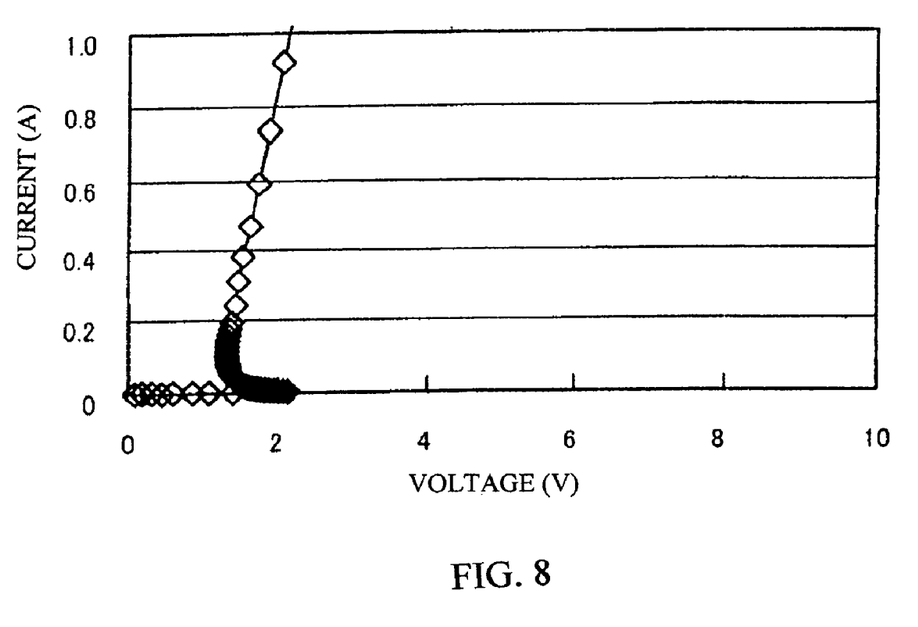
FIG. 8 is a graph showing a current-voltage relationship of a trigger element according to the third embodiment.
Figure 9:
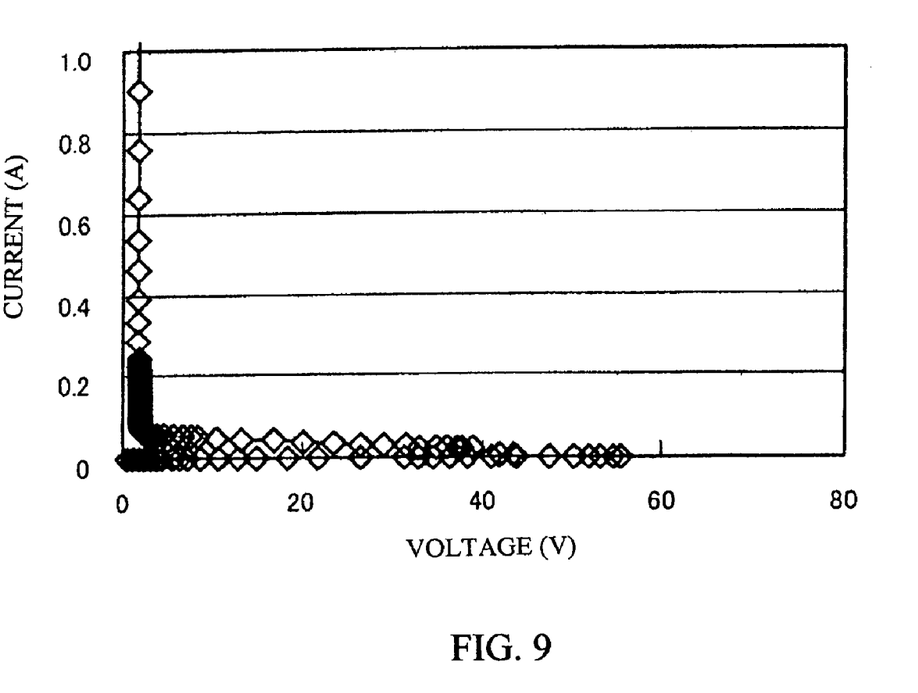
FIG. 9 is a graph showing a current-voltage relationship of an SCR element according to the third embodiment.

In the next step, similar to the first embodiment, the removal portion 30 and the cavity 31 are formed in the semiconductor device 10 with an SOI structure, and the SCR element 1 is formed on the P type substrate 11 adjacent to the cavity 31 as the ESD protection element. At this time, at least the drain electrode 54 of the trigger element 50 is situated just above the cavity 31. Then, the signal terminal 35 is connected to the SCR element 1, the trigger element 50, and the n-MOS element 20 as the inner element. As shown in current-voltage relationships in FIGS. 8 and 9, a breakdown voltage of the SCR element 1 is set at about 50 V, and a breakdown voltage of the trigger element 50 is set at about 3 V. The breakdown voltage of the trigger element 50 is set lower than the breakdown voltage of the inner circuit. Accordingly, it is possible to obtain the ESD protection element for the semiconductor device 10 having a low supply voltage for operating the inner element. The breakdown voltages of the SCR element 1 and the trigger element 50, or the n-MOS element, are set similarly to the first and second embodiments.

When a large current due to static charge is applied to the signal terminal 35 of the semiconductor device 10 with the SCR element 1 having the trigger element 50 with the breakdown voltage set as described above, the large potential is applied to the N+ area 4a and 25a on the anode side of the SCR element 1 and the drain electrode 24 of the n-MOS element 20. At this time, the current flows through the drain electrode 24 of the n-MOS element 20 as the inner element, and the drain electrode 54 of the trigger element 50. Since the breakdown voltage of the trigger element 50 is set lower than the breakdown voltage of the inner circuit, the trigger element 50 reaches the breakdown voltage first at a rated voltage of the inner element.

Further, the N+ area 4a of the SCR element 1 on the anode side has a potential same as that of the drain electrode 54 of the trigger element 50, and the signal terminal 35 is connected to the drain electrode 54 of the trigger element 50 through the resistance 57. Accordingly, the current tends to flow through the P+ area 5a on the anode side connected to the removal portion 30 in series. After the trigger element 50 reaches the breakdown voltage and the current flows through the trigger element 50 instantly, the current rapidly flows through the SCR element 1, thereby protecting the inner circuit from the static charge.

Figure 10:
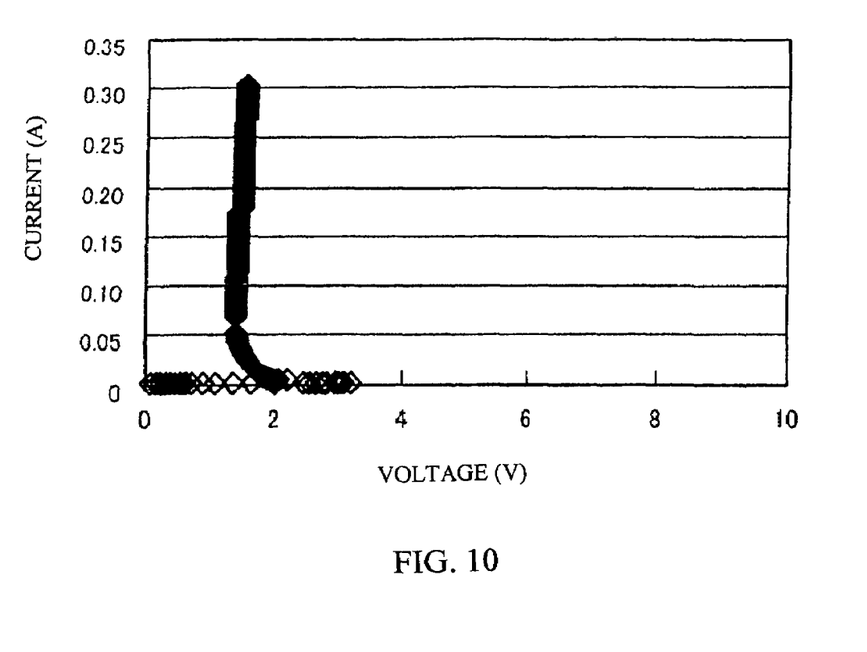
FIG. 10 is a graph showing a current-voltage relationship of a combination of the trigger element and the SCR element according to the third embodiment.

When the trigger element 50 and the SCR element 1 are combined, the breakdown voltage becomes about 3 V as shown in the current-voltage relationship in FIG. 10. After the breakdown, the large current flows as indicated by the current-voltage relationship of the SCR element 1 shown in FIG. 9, thereby protecting the inner circuit from the static charge. The trigger element 50 is provided for reducing the breakdown voltage of the SCR element 1, and an electrode thereof needs to have a width (perpendicular to the drawing in FIG. 7) wide enough just for withstanding a current instantly.

Further, the cavity 31 as the air layer is disposed just below the drain electrode 54 of the n-MOS element constituting the trigger element 50. Accordingly, it is possible to reduce capacitance just below the drain electrode 54 and capacitance of a depleted layer between the channel 51 and the N+ area 52d connected to the drain electrode 54, thereby increasing an operation speed of the trigger element 50 and effectively operating as the ESD protection element of the semiconductor layer. As described above, when at least a part of the trigger element as the second semiconductor element is formed in the second area, it is possible to increase an operation speed of the semiconductor element and effectively operate the ESD protection element.

In the third embodiment, as described above, the trigger element 50 is the n-MOS element, and may be a p-MOS element. The semiconductor layer and the insulating layer are removed in the semiconductor device with an SOI structure. The SCR element is formed on the P type semiconductor substrate, or the bulk layer, as the ESD protection element. Accordingly, in the case that the semiconductor element has a low supply voltage, it is possible to provide the SCR element with the ESD protection function due to the low breakdown voltage of the trigger element. Therefore, in addition to the advantages of the first embodiment, it is possible to obtain the ESD protection element corresponding to the low supply voltage of the inner circuit of the semiconductor device with the SOI structure.

Further, the cavity is provided just below the trigger element as the air layer, thereby increasing an operation speed of the trigger element 50. Accordingly, it is possible to effectively operate the ESD protection element of the inner circuit with the low supply voltage formed in a thin semiconductor layer.

In the embodiments described above, the ESD protection element is formed in the P type semiconductor substrate as the bulk layer after the inner circuit is formed in the semiconductor layer and the removal portion and the cavity are formed. Alternatively, the removal portion and the cavity may be formed in the semiconductor layer only with the element separation area first. Then, the inner circuit, the trigger element, and the ESD protection element are formed in the semiconductor layer and on the P type semiconductor substrate at the bottom of the removal portion at the same time. Accordingly, it is possible to make the manufacturing process of the semiconductor device with the SOI structure having the ESD protection element simple. Also, in the embodiments, the bulk layer is formed of the silicon substrate, and may be formed of a sapphire substrate or a germanium substrate.

The disclosure of Japanese Patent Application No. 2004-267676, filed on Sep. 15, 2004, is incorporated in the application.

While the invention has been explained with reference to the specific embodiments of the invention, the explanation is illustrative and the invention is limited only by the appended claims.

What is claimed is:

1. A semiconductor device, comprising:
   a laminated substrate having a bulk layer, an insulating layer laminated onto the bulk layer, and a semiconductor layer laminated onto the insulating layer;
   a removal portion disposed adjacent to the laminated substrate;
   a cavity disposed in the laminated substrate below a part of the insulating layer so that the laminated substrate has a first portion having the cavity and a second portion having no cavity, the cavity opening toward the removal portion, the cavity and the removal portion sharing a continuous space;
   a first semiconductor element formed in the removal portion; and
   a second semiconductor element formed partially in the first portion and partially in the second portion.

2. A semiconductor device according to claim 1, wherein said first semiconductor element includes an electro static discharge (ESD) protection element.

3. A semiconductor device according to claim 2, wherein said ESD protection element includes a silicon controlled rectifier (SCR) element.

4. A semiconductor device according to claim 2, wherein said second semiconductor element is electrically connected to the ESD protection element as a trigger element of the ESD protection element.

5. A semiconductor device according to claim 1, wherein said cavity has a bottom surface at a level same as the removal portion.

6. A semiconductor device according to claim 1, wherein said second semiconductor element includes a first area formed in the first portion and a second area formed in the second portion, the first and second areas being in the semiconductor layer only.

7. A semiconductor device according to claim 1, wherein said first semiconductor element is connected to a signal terminal for receiving an external signal.

8. A semiconductor device according to claim 1, wherein said second semiconductor element is connected to a signal terminal for receiving an external signal.

9. A semiconductor device according to claim 1, wherein said second semiconductor element includes a metal oxide semiconductor (MOS).

10. A semiconductor device according to claim 1, wherein said first semiconductor element is directly connected to the second semiconductor element.

11. A semiconductor device according to claim 1, wherein said second semiconductor element includes a gate electrode, a source electrode, and a drain electrode, at least one of said gate electrode, said source electrode, and said drain electrode being situated in the first portion, the others of said gate electrode, said source electrode, and said drain electrode being situated in the second portion.

12. A semiconductor device, comprising:
a laminated substrate having a laminated area and a removal area adjacent to the laminated area, the laminated area having a bulk layer, an insulating layer laminated onto the bulk layer, and a semiconductor layer laminated onto the insulating layer, the removal area having the bulk layer exposed from the insulating layer and the semiconductor layer, and a removal portion disposed onto the bulk layer;
a cavity disposed in the laminated area of the laminated substrate below a part of the insulating layer so that the laminated area has a first portion having the cavity and a second portion having no cavity, the cavity opening toward the removal portion, the cavity and the removal portion sharing a continuous space;
a first semiconductor element formed in the removal portion; and
a second semiconductor element formed partially in the first portion and partially in the second portion.

13. A semiconductor device, comprising:
a laminated substrate having a laminated area and a removal area next to the laminated area, the laminated area having a first portion, a second portion, and laminated layers including
a bulk layer,
a semiconductor layer, and
an insulating layer between the bulk and semiconductor layers, the removal area being on the bulk layer;
a cavity below the insulating layer, in the first portion and not in the second portion, the cavity having an opening toward the removal portion, the cavity and the removal portion sharing a continuous space; and
a semiconductor element partially in the first portion and partially in the second portion.

* * * * *